United States Patent
Staab et al.

(10) Patent No.: US 7,234,120 B1
(45) Date of Patent: Jun. 19, 2007

(54) FAULT ISOLATION IN A PROGRAMMABLE LOGIC DEVICE

(75) Inventors: Donald Audley Staab, Sunnyvale, CA (US); Ian L. McEwen, Golden, CO (US); Reto Stamm, Sunnyvale, CA (US); Phoumra Tan, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 328 days.

(21) Appl. No.: 10/959,389

(22) Filed: Oct. 6, 2004

(51) Int. Cl.
 *G06F 17/50* (2006.01)
(52) U.S. Cl. ............................................. 716/4
(58) Field of Classification Search ............ 716/4;
 714/724, 725
 See application file for complete search history.

(56) References Cited

U.S. PATENT DOCUMENTS

| | | | | |
|---|---|---|---|---|
| 6,003,150 A | * | 12/1999 | Stroud et al. ............... | 714/725 |
| 6,108,806 A | * | 8/2000 | Abramovici et al. ......... | 714/725 |
| 6,397,362 B1 | * | 5/2002 | Ishiyama ..................... | 714/724 |
| 2003/0056163 A1 | * | 3/2003 | Rajsuman et al. ........... | 714/724 |
| 2004/0015735 A1 | * | 1/2004 | Norman ....................... | 714/10 |
| 2004/0177314 A1 | * | 9/2004 | Kleihorst et al. ............ | 714/801 |
| 2004/0216081 A1 | * | 10/2004 | Wells et al. .................. | 716/18 |

* cited by examiner

*Primary Examiner*—Paul Dinh
*Assistant Examiner*—Suchin Parihar
(74) *Attorney, Agent, or Firm*—LeRoy D. Maunu

(57) ABSTRACT

Identification of a faulty net in a design implemented on a programmable logic device (PLD). In one approach, configuration data is generated to implement a duplicate circuit of a failing sub-circuit in the design. The PLD is configured with the configuration data that implements the failing sub-circuit and the duplicate circuit, and at least one set of input signals is applied to the sub-circuit and the duplicate circuit. A signal from each net in the sub-circuit is compared on the PLD to a corresponding net in the duplicate circuit. In response to the signal from the net in the sub-circuit being unequal to a signal from the corresponding net in the duplicate circuit, the net in the sub-circuit is identified as faulty.

15 Claims, 5 Drawing Sheets

FAULT ISOLATION IN A PROGRAMMABLE LOGIC DEVICE

FIELD OF THE INVENTION

The present invention generally relates to identifying faulty signal circuitry in a programmable logic device (PLD).

BACKGROUND

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored on-chip in non-volatile memory, then downloaded to volatile memory as part of an initial configuration sequence.

For all of these programmable logic devices (PLDs), the functionality of the device is controlled by configuration data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable.

An error detected during operation of a PLD may generally be traced to either a design flaw or faulty circuitry within the PLD. In response to detecting an error, various diagnostic measures may be performed to learn and correct the source of an error. Various function tests may be performed on a design implemented on a PLD in order to identify an error in the design. If a design error is identified, the design may be changed and the PLD reconfigured with the implementation of the corrected design.

If a design error is ruled out, various tests may be performed on the PLD to determine whether the circuitry on the PLD is defective. Depending on the design requirements and extent of defective circuitry, a PLD with defective circuitry may still be usable by recompiling the design to exclude use of the defective components on the PLD. Alternatively, a failing part may be removed from an application system and submitted for root cause analysis. The part may be removed and further tested in order to identify the exact location of failure in order to determine the cause of failure and initiate a corrective action to prevent subsequent failures.

Determining the location and extent of the faulty circuitry may involve substantial manually performed operations. At present, tests are available to identify failing logic blocks on a die. Once a failing CLB has been identified using the equivalent of a standard test vector set, a CAD tool may be required to manually tap and route test points on the input and outputs of the identified failing circuit block to available unused peripheral IO pins and rewrite the test program to compare the new outputs to expected values. The expected values must be calculated based on examination of the logic design. By process of elimination the failing path may be determined.

Once the failing path is identified, the path may be highlighted in a CAD tool and the coordinates recorded for all points along the path. This information may be used to recreate the path on the failing part once the part has been cleared of all other configurations. After the part has been reconfigured with the failing path isolated, the coordinates of the points where the failing signal is routed through the programmable routing matrix and recorded. Once these points are known, these points need to be manually tapped and routed to available I/O pins, and the test program must be rewritten to monitor these IO pins compared to a calculated expected output. The failing output identifies the failing node.

The present invention may address one or more of the above issues.

SUMMARY OF THE INVENTION

The various embodiments of the invention support identification of a faulty net in a design implemented on a programmable logic device (PLD). In one embodiment, configuration data is generated to implement a duplicate circuit of a failing sub-circuit in the design. The PLD is configured with the configuration data that implements the failing sub-circuit and the duplicate circuit, and at least one set of input signals is applied to the sub-circuit and the duplicate circuit. A signal from each net in the sub-circuit is compared to a corresponding net in the duplicate circuit. In response to the signal from the net in the sub-circuit being unequal to a signal from the corresponding net in the duplicate circuit, the net in the sub-circuit is identified as faulty.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

The various embodiments of the invention support identification of the exact location on the die of a physical failure within a logic block or signal paths within programmable logic circuitry. Once the location of a defect has been identified within the programmable logic circuitry, a signal may be routed around the defect, or additional analysis may be performed to determine the cause of the defect.

Figure 1A:
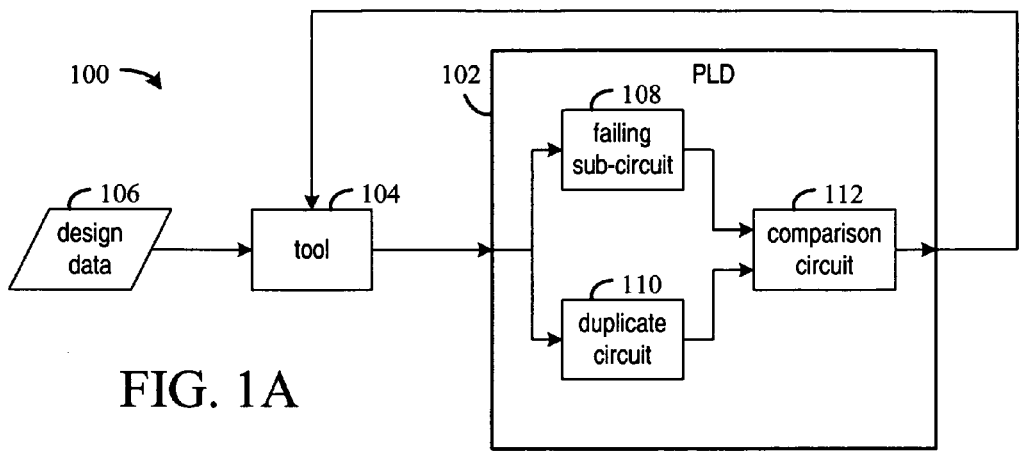
FIG. 1A is a block diagram of an arrangement for isolating failing circuitry on a PLD in accordance with various embodiments of the invention.

FIG. 1A is a block diagram of an arrangement 100 for isolating failing circuitry on a PLD in accordance with various embodiments of the invention. PLD 102 is a device on which a problem was detected, and tool 104 is a collection of software tools for performing various operations in isolating the defect on the PLD. Design data 106 is configuration data that implements the design on the PLD, along with first order input values and output values identified by automated test equipment (ATE) in response to a failing test vector.

The failing sub-circuit 108 is the portion of the overall design specified by design data 106 and identified by tool 104 as having the defective circuitry. The failing sub-circuit occupies the same logic blocks and uses the same signal routes in the PLD as if the overall design were implemented on the PLD.

The duplicate circuit 110 is a copy of the logic and signal routing of the failing sub-circuit 108. Both the failing sub-circuit and the duplicate circuit receive the same input signals as provided by tool 104. The comparison circuit 112 is coupled to receive and compare corresponding signals from both the failing sub-circuit 108 and the duplicate circuit 110. Results of the comparisons are provided to the tool 104, which from the results determines a location of the failure in the failing sub-circuit 108.

Figure 1B:
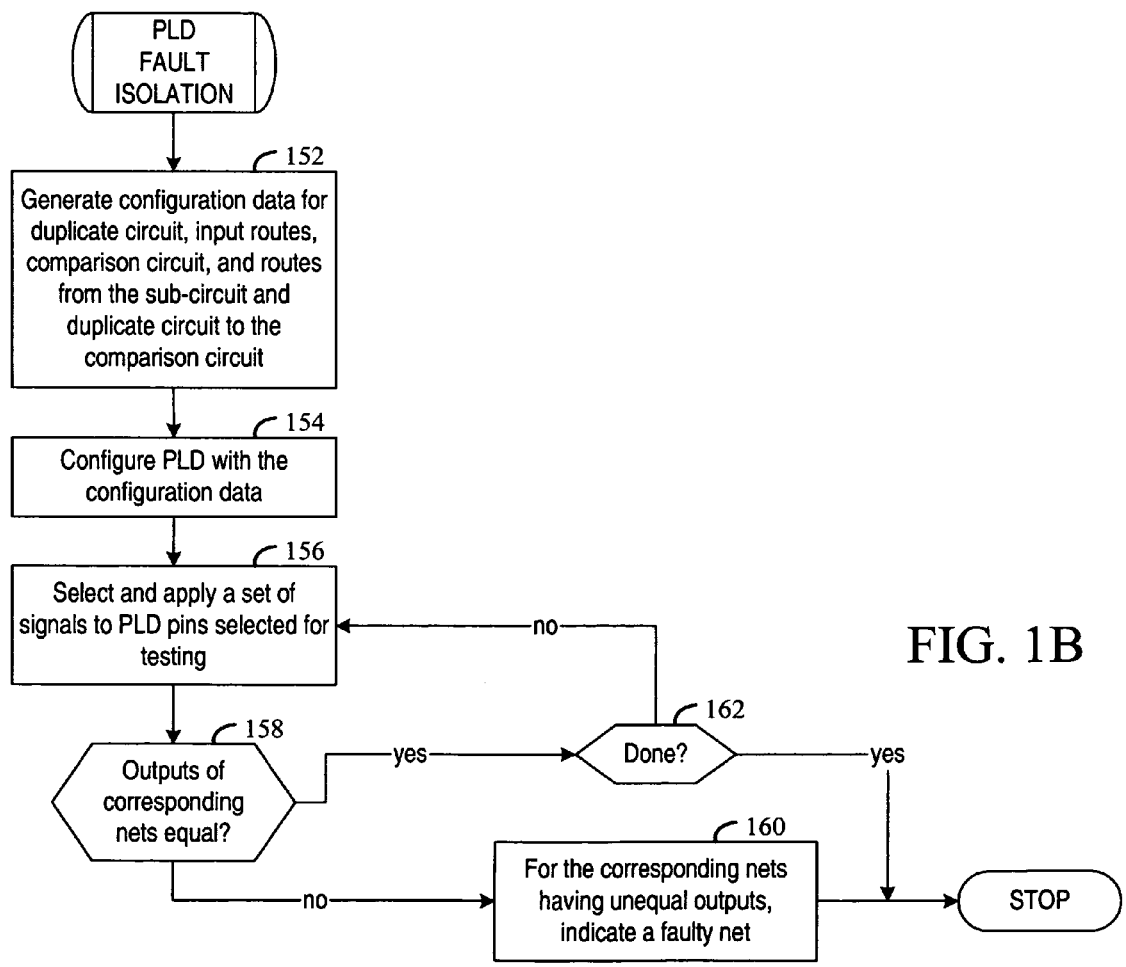
FIG. 1B is a flowchart of an example process for identifying a faulty net on a PLD in accordance with various embodiments of the invention.

FIG. 1B is a flowchart of an example process for identifying a faulty net on a PLD in accordance with various embodiments of the invention. The process describes functions performed by and with tool 104 in identifying the location of the failing circuitry.

Tool 104 provides functions for generating a test design, routing signals in the design, generating a configuration bitstream from the test design, configuring the PLD with the bitstream, and testing the configured PLD with selected test vectors. In generating a test design, the tool generates configuration data to implement the duplicate circuit 110 and the comparison circuit 112, along with the required signal routes (step 152). As shown in FIG. 1A, the signal routes are from selected input pins of the PLD to both the failing sub-circuit 108 and the duplicate circuit 110, and from the failing sub-circuit and the duplicate circuit to the comparison circuit 112. In addition, configuration data is established to implement the signal routes from the comparison circuit to output pins of the PLD.

The tool 104 may then be used to configure the PLD with the configuration data (step 154) and apply selected test vectors to the PLD (step 156). In one embodiment the test vectors may be applied manually by an operator using a personal computer connected to a bench test circuit arrangement such as a AFX board, which is available from Xilinx, Inc. In another embodiment, software on a personal computer may automatically control application of the test vectors and analyze output from the PLD.

If in response to an input test vector, the signals of corresponding nets in the failing sub-circuit 108 and the duplicate circuit 110 are not equal (decision step 158), the output signal from the comparison circuit 112 indicates the failing net to the tool 104. The failing net may then be noted for further analysis (step 160). In addition, the set of test vectors that produced the error may be archived for future use.

If none of the signals from the comparison circuit 112 indicate a mismatch between the failing sub-circuit 108 and the duplicate circuit 110, the process continues if there are further test vectors to apply (decision step 162). Once all test vectors have been applied or the failing net has been identified, the process is complete. At least one of the available test vectors should result in an error signal from the comparison circuit 112 if the test vectors used in fault isolation process reflect the states of signals when the error was originally detected in the complete circuit.

Figure 2:
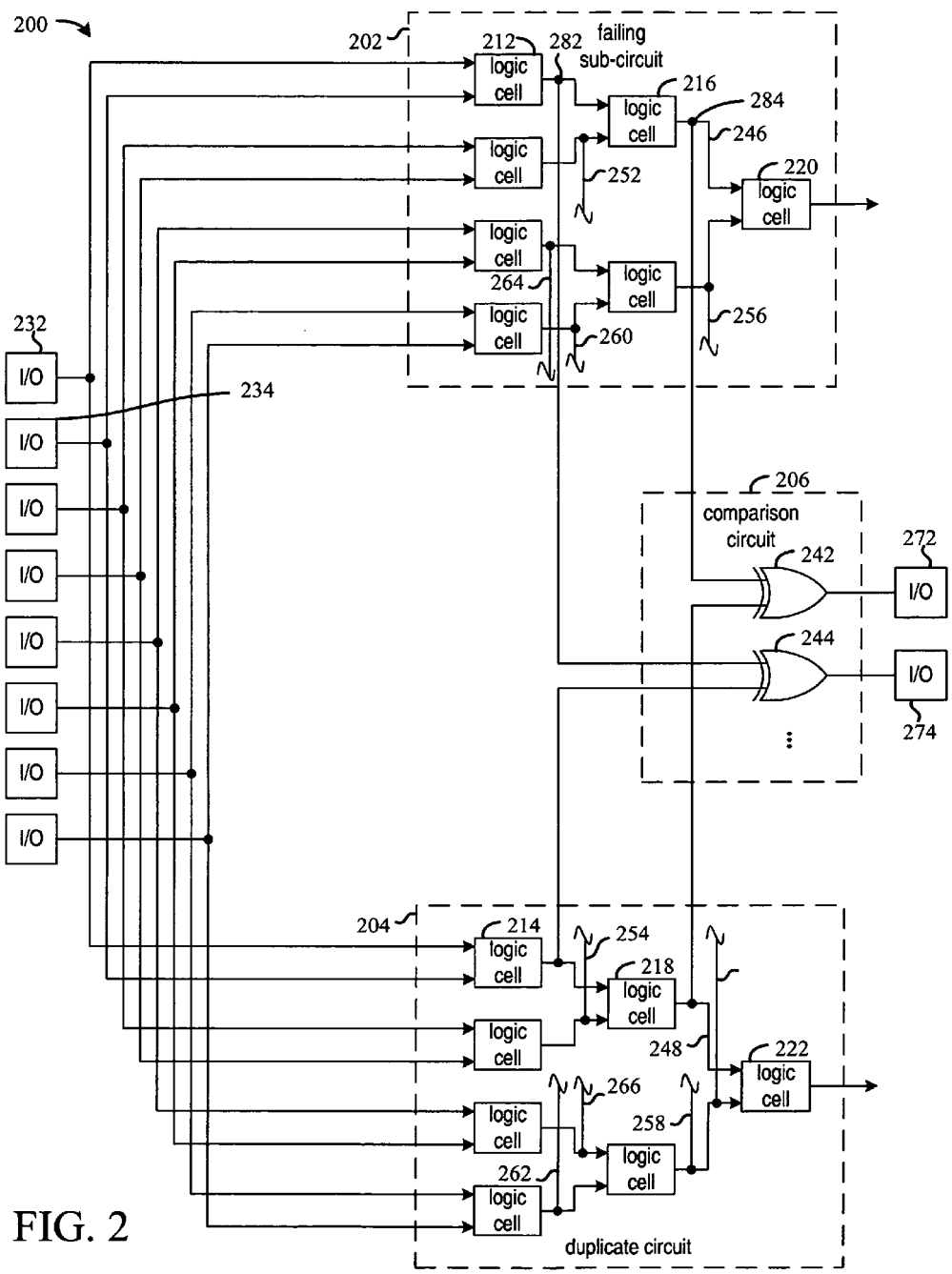
FIG. 2 is a schematic diagram of circuitry implemented on a PLD for identifying a failing net in an example sub-circuit.

FIG. 2 is a schematic diagram of circuitry implemented on a PLD for identifying a failing net in an example sub-circuit. The logic cells in block 202 represent an example of a failing sub-circuit, and the corresponding logic cells in block 204 represent a duplicate of the failing sub-circuit. Block 206 illustrates a portion of an example embodiment of a comparison circuit. In an example application, the logic cells represent blocks of programmable circuitry in certain types of PLDs, such as the configurable logic blocks of an FPGA.

The logic cells in the duplicate circuit 204 correspond to the logic cells in the failing sub-circuit 202 and are similarly connected. For example, logic cell 212 in the failing sub-circuit corresponds to logic cell 214 in the duplicate circuit; logic cell 216 in the failing sub-circuit corresponds to logic cell 218 in the duplicate circuit; and logic cell 220 in the failing sub-circuit corresponds to logic cell 222 in the duplicate circuit. The signal lines between the logic cells shown that the connections between the logic cells in the duplicate circuit are similar to the connections in the failing sub-circuit so as to implement the same functionality.

Each input pin of the failing sub-circuit and the corresponding input pin of the duplicate circuit are coupled to the same PLD input pin. For example, logic cells 212 and 214 are coupled to I/O pins 232 and 234. It will be appreciated that the particular configuration of logic cells, interconnections between the cells, and connections to I/O pins will vary according to function implemented by the failing sub-circuit.

A portion of an example embodiment of comparison circuit 206 is illustrated by XOR circuits 242 and 244. Each XOR circuit compares corresponding signals from the failing sub-circuit and the duplicate circuit. For example, XOR circuit 242 compares signals on line 246 in the failing sub-circuit and on line 248 in the duplicate circuit. It will be appreciated that the comparison circuit 206 includes additional XOR circuits (not shown) to correspond to the other signals in the failing sub-circuit and the duplicate circuit. For example, additional respective XOR circuits would be included for the pairs of signals on lines 252 and 254, 256 and 258, 260 and 262, and 264 and 266.

The comparison circuit 206 is coupled to PLD I/O pins for outputting signals that indicate the comparison results. For example, XOR circuit 242 is coupled to I/O pin 272, and XOR circuit 244 is coupled to I/O pin 274.

Unequal voltage levels of corresponding signals between the failing sub-circuit and the duplicate circuit indicates suspect circuitry in the net. For example, if the output of XOR circuit 242 indicates an unequal input signals and the output of XOR circuit 244 indicates equal input signals, then the circuitry in the failing sub-circuit between probe points 282 and 284 is suspect.

Figure 3:
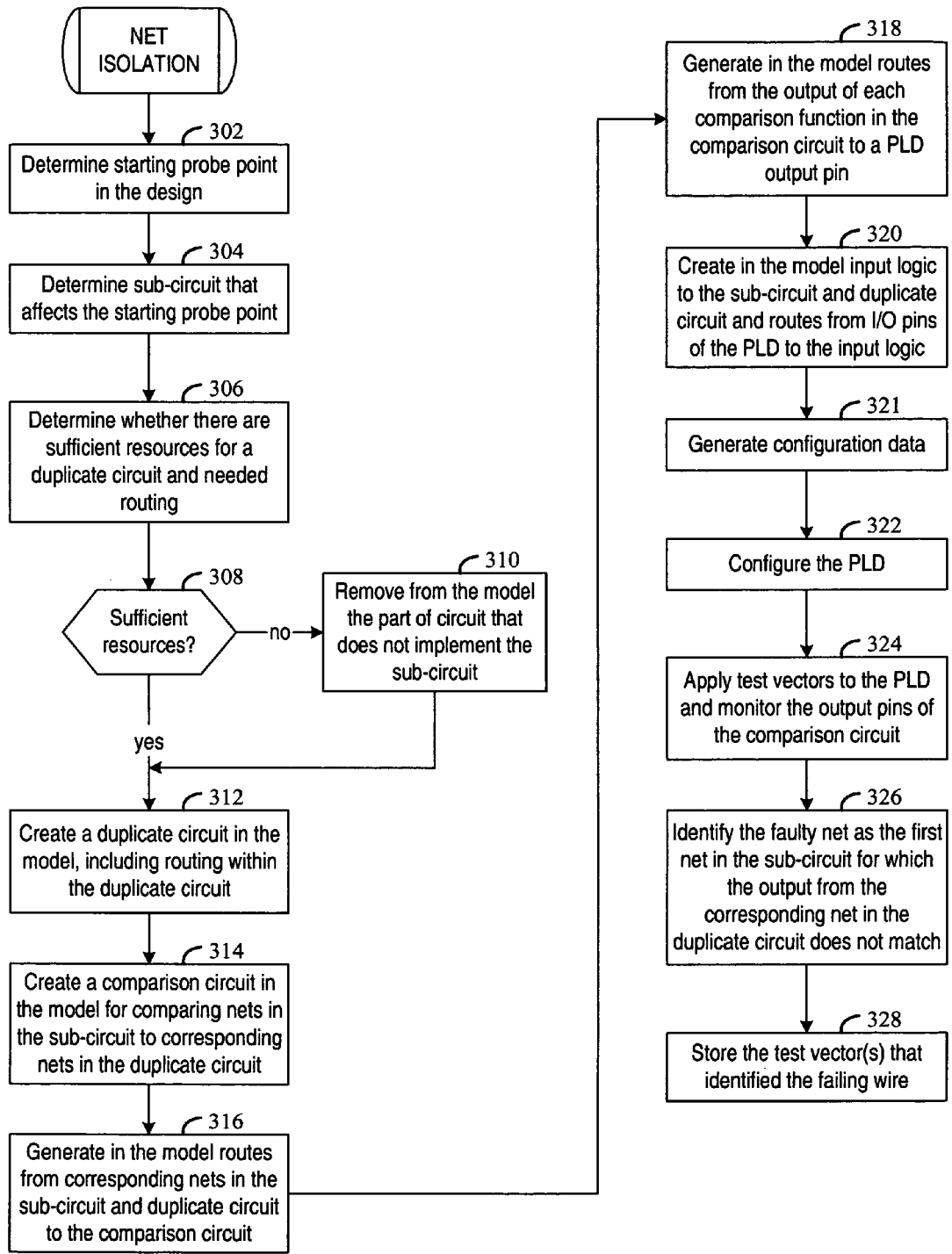
FIG. 3 is a flowchart of an example process for identifying a failing net in accordance with various embodiments of the invention.

FIG. 3 is a flowchart of an example process for identifying a failing net in accordance with various embodiments of the invention. A starting probe point in the design is determined (step 302) and used in selecting the sub-circuit to be analyzed to isolate the defect. Generally, a failure in an application or a diagnostic test program or both will be detected at an output of the device.

From the starting probe point, a sub-circuit is determined (step 304). The sub-circuit may be referred to as a "logic cone" and includes all the logic that affects the starting probe point. A software-based tracing method may be used to determine the logic cone. The backward tracing terminates at any location where a valid response to an input vector is determined, typically a flip flop output or an I/O circuit driving into the logic cone. In an example embodiment related to an FPGA (from Xilinx, for example), the backward tracing may be performed with support of a readback logic block present on the PLD and interfacing with a CAD schematic design tool. Reading the output of the readback block and comparing that output with actual output from a known good device or expected output from a simulation of the circuit for a standard test vector allows a bit map to be produced to identify the failing configurable logic block (CLB). Nodes within the CLB and on the nets leading up to and out of the failing CLB may be probed to identify the point of failure.

Once a failing sub-circuit has been determined for probing, the process determines whether the PLD has sufficient unused resources to support a duplicate of the failing sub-circuit (step 306). If there are not sufficient resources (decision step 308), part of the circuit that does not implement the failing sub-circuit is removed from a model of the circuit (step 310). Otherwise, no parts of the circuit are removed. A duplicate of the failing sub-circuit is created in the model (step 312). It will be appreciated that various design tools may be used to manipulate the configuration data for the PLD by way of a tool-specific model of the configuration data that implements the circuit. In duplicating the failing sub-circuit, the resources and nodes may be copied and placed in locations relative to the failing sub-circuit. Alternatively, a library of placer routines may be used to place the resources and nodes of the duplicate circuit in a more compact arrangement than that of the failing sub-circuit.

A comparison circuit is created in the model to compare the signals in the failing sub-circuit to corresponding signals in the duplicate circuit (step 314). The comparison circuit may be created automatically based on the number of points to probe in the failing sub-circuit. The probe points may be identified using a probe and router tool. In an example embodiment, the comparison circuit is made with a number of XOR circuits, with each XOR circuit corresponding to a probe point in the failing sub-circuit. Those skilled in the art will appreciate alternative circuitry for comparing pairs of signals from the failing sub-circuit and the duplicate circuit.

An embodiment of a probe and router tool includes software that uses a name of a signal to probe either a set of accessible points having every accessible point on the signal or a specified subset of accessible points of the set. The accessible points specified in the subset may be selected by a list or by using regular expressions. The software routes each of accessible points of the set or subset of accessible points to at least one of a flip-flop for readback, an input/output for readback, or a comparison circuit for comparison.

Thus the one embodiment may be implemented on a computer system having software code stored in a computer readable medium for identifying a faulty net in a design implemented on a programmable logic device (PLD). The code includes: code for generating configuration data that implements a duplicate circuit of a failing sub-circuit in the design; and code for configuring the PLD with the configuration data that implements the failing sub-circuit and the duplicate circuit. This code may either have code in a separate probe and router program or in the same program that includes: code for probing at least one accessible point of a signal in the failing sub-circuit; and code for routing the at least one accessible point to a comparison circuit for comparing a signal of the at least one accessible point with a related signal in the duplicate circuit.

For each probe point in the failing sub-circuit and the corresponding probe point in the duplicate circuit, the signals are routed to an XOR circuit in the comparison circuit (step 316).

The outputs from the comparison circuit (output from each XOR circuit) are routed to unused output pins of the PLD (step 318). Similarly, input logic is established for the input pins of the PLD device to connect to the input pins of the failing sub-circuit and the input pins of the duplicate circuit (step 320). The input pins are configured in a standard I/O format so that test vector signals may be applied.

At step 321, configuration data is generated from the model of the failing sub-circuit, the duplicate circuit, the comparison circuit, and the needed signal routes. The PLD is then configured with the configuration data (step 322), and application of the desired test vectors may begin (step 324). The PLD output pins connected to the comparison circuit are monitored for a signal that indicates that a pair of corresponding signals in the failing sub-circuit and duplicate circuit are unequal. The faulty net is that in which a signal from a probe point is first (i.e. closest to the input) to be not equal to the corresponding signal in the duplicate circuit (step 326). A mapping of PLD output pins to XOR circuits to the various probe points may be used to identify the failing net. The set of test vectors that produced the error may be stored for future use (step 328), for example, on a disk or network storage arrangement. Once a failing net has been identified, further analysis may be performed to identify a failing wire segment within the net.

Figure 4:
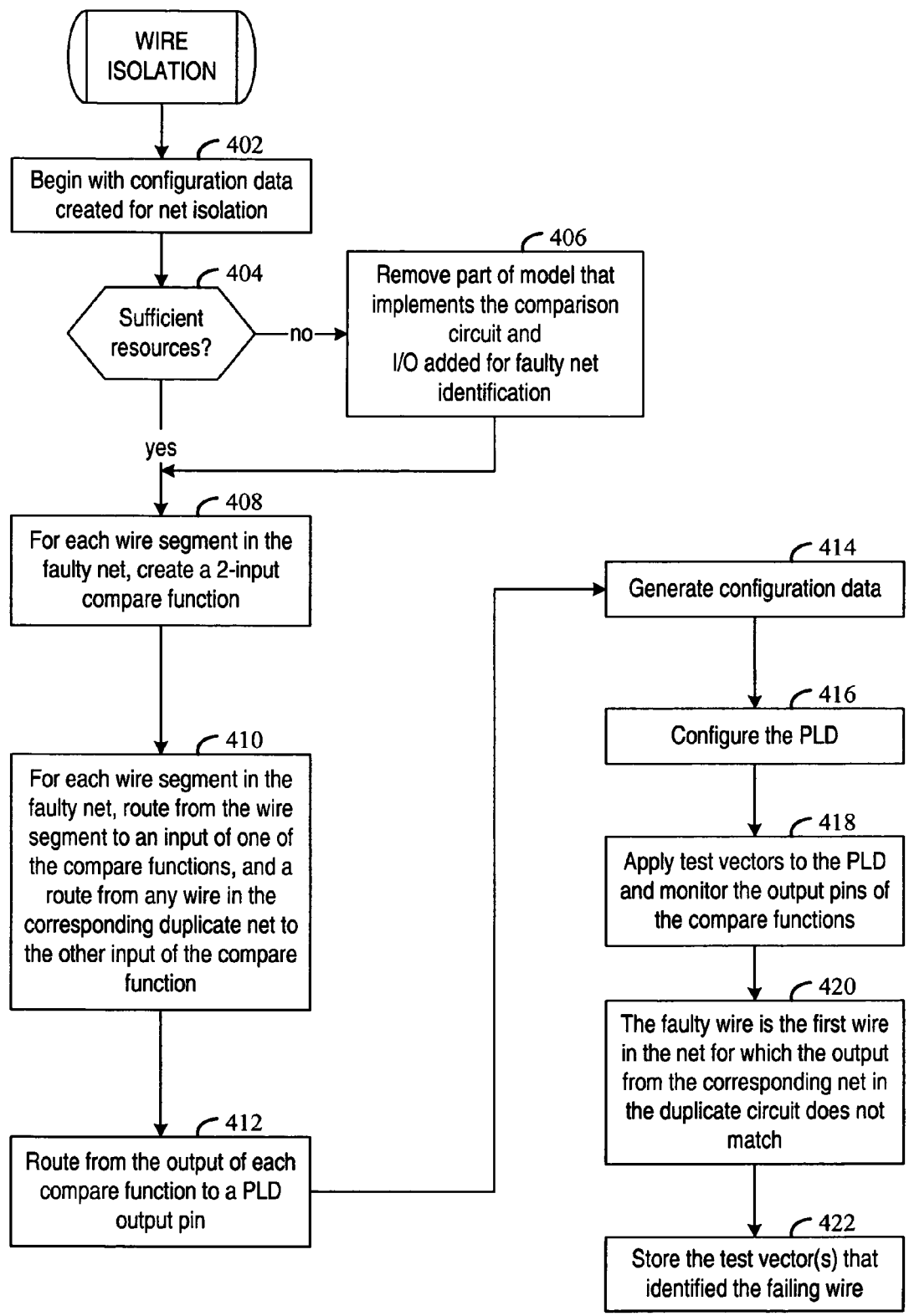
FIG. 4 is a flowchart of an example process for identifying a failing wire segment in a net in accordance with various embodiments of the invention.

FIG. 4 is a flowchart of an example process for identifying a failing wire segment in a net in accordance with various embodiments of the invention. The process begins with the configuration data generated for net isolation (step 402) as described in FIG. 3.

If there are insufficient resources to perform the wire isolation (decision step 404), the parts of the model that implement the comparison circuit for net isolation, along with the I/O logic for net isolation, are removed.

For each wire segment in the faulty net, a two-input compare function (e.g., an XOR circuit) is created in the model (step 408). Also for each wire segment in the faulty net, a signal route is made to one input of the compare function (step 410). The other input of each compare function is for a signal from the corresponding net in the duplicate circuit. It will be appreciated that from the duplicate circuit any wire segment in the net may be used as the probe point.

The output from each compare function is routed to a PLD output pin (step 412), and configuration data is generated from the updated model (step 414).

Once the PLD is configured with the new configuration data (step 416), test vectors are applied to the PLD (step 418), and the PLD output pins tied to the compare functions are monitored. The faulty wire segment is the first wire segment in the net for which the compare function indicates unequal voltage levels of input signals (step 420). A mapping of PLD pins to compare functions to wire segments may be used to determine the failing wire segment. The set of test vectors that produced the error may be archived for future use (step 422).

Figure 5:
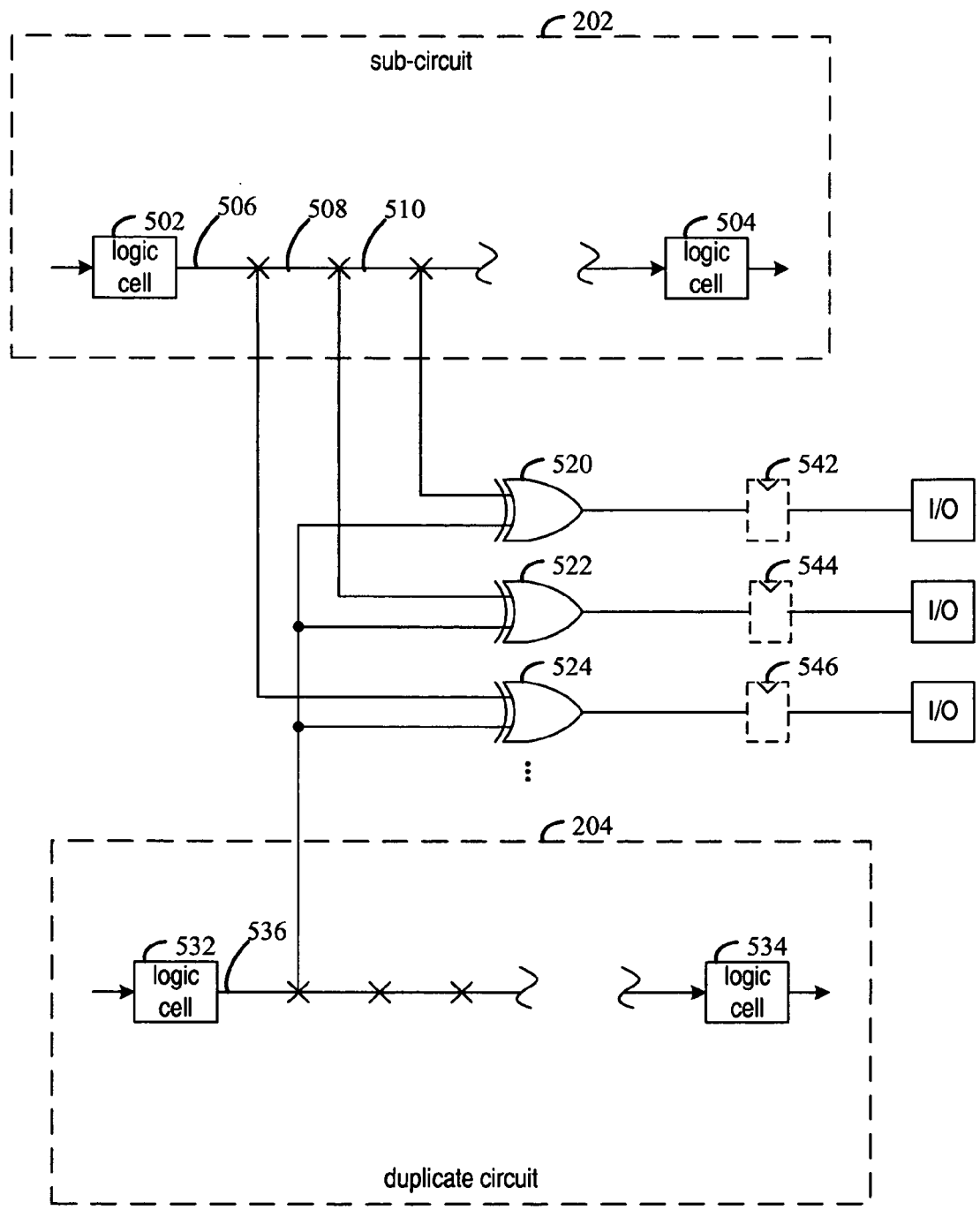
FIG. 5 is a schematic diagram of circuitry implemented on a PLD for identifying a failing wire segment in an example net.

FIG. 5 is a schematic diagram of circuitry implemented on a PLD for identifying a failing wire segment in an example net. The failing net includes between logic cells 502 and 504 the wire segments 506, 508, and 510. Additional wire segments are not labeled to avoid cluttering the figure. Example compare functions are implemented with XOR circuits 520, 522, and 524, each of which has one input connected to a probe point which is tied to one of wire segments 506, 508, and 510, respectively.

Logic cells 532 and 534 in duplicate circuit 204 correspond to cells 502 and 504 in the failing sub-circuit 202. Each other input of the XOR circuits 520, 522, and 524 is coupled to any one of the wire segments between cells 532 and 534 in the duplicate circuit. In the example a probe point that is tied to wire segment 536 is coupled to the XOR circuits. Depending on timing sensitivities between the failing sub-circuit and the duplicate circuit, one or more flip-flops may be required to buffer the respective output signals from the XOR circuits, as shown by flip-flops 542, 544, and 546.

Those skilled in the art will appreciate that various alternative computing arrangements would be suitable for hosting the processes of the different embodiments of the present invention. In addition, the processes may be provided via a variety of computer-readable media or delivery channels such as magnetic or optical disks or tapes, electronic storage devices, or as application services over a network.

The present invention is believed to be applicable to a variety of systems for identifying failing circuitry and has been found to be particularly applicable and beneficial in identifying failing nets and wires in FPGAs. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for identifying a faulty net in a design implemented on a programmable logic device (PLD), comprising:
   generating configuration data that implements a duplicate circuit of a failing sub-circuit in the design;
   configuring the PLD with the configuration data that implements the failing sub-circuit and the duplicate circuit;
   applying at least one set of input signals to the sub-circuit and the duplicate circuit;
   comparing a signal from each net in the sub-circuit to a corresponding net in the duplicate circuit;
   identifying a net in the sub-circuit as faulty in response to the signal from the net in the sub-circuit being unequal to a signal from the corresponding net in the duplicate circuit;
   comparing a signal from each segment of a plurality of wire segments in the faulty net to a signal from a segment of wire in the corresponding net in the duplicate circuit; and
   identifying a wire segment of the plurality of wire segments in the faulty net as faulty in response to the signal from the wire segment in the faulty net being unequal to the signal from the segment of wire in the corresponding net of the duplicate circuit.

2. The method of claim 1, further comprising storing in retentive storage data that indicates states of a set of input signals that produce unequal voltage levels between a net in the sub-circuit and a corresponding net in the duplicate circuit.

3. An apparatus for identifying a faulty net in a design implemented on a programmable logic device (PLD), comprising:
   means for generating configuration data that implements a duplicate circuit of a failing sub-circuit in the design;
   means for configuring the PLD with the configuration data that implements the failing sub-circuit and the duplicate circuit;
   means for applying at least one set of input signals to the sub-circuit and the duplicate circuit;
   means for comparing a signal from each net in the sub-circuit to a corresponding net in the duplicate circuit;
   means for identifying a net in the sub-circuit as faulty in response to the signal from the net in the sub-circuit being unequal to a signal from the corresponding net in the duplicate circuit;
   means for comparing a signal from each segment of a plurality of wire segments in the faulty net to a signal from a segment of wire in the corresponding net in the duplicate circuit; and
   means for identifying a wire segment of the plurality of wire segments in the faulty net as faulty in response to the signal from the wire segment in the faulty net being unequal to the signal from the segment of wire in the corresponding net of the duplicate circuit.

4. A method for identifying a faulty net in a design implemented in a programmable logic device (PLD), comprising:
   generating a first configuration data set that implements a sub-circuit of a design on a PLD, that implements a duplicate circuit of the sub-circuit on the PLD, that implements respective routes on the PLD for input signals from a plurality of PLD input pins to respective input pins of the sub-circuit and to corresponding input pins of the duplicate circuit, that implements a first comparison circuit, that implements a respective route from each net in the sub-circuit to an input of the comparison circuit and a respective route from each net in the duplicate circuit that corresponds to a net in the sub-circuit, to an input pin of the comparison circuit;
   configuring the PLD with the first configuration data set;
   applying one or more test vectors to the plurality of PLD input pins;
   identifying a net in the sub-circuit as faulty in response to the first comparison circuit detecting unequal signals from the net in the sub-circuit and the corresponding net in the duplicate circuit;
   determining whether the PLD has sufficient resources to implement the duplicate circuit of the sub-circuit along with the design; and
   generating the first configuration data set without parts of the design that are not part of the sub-circuit in response to determining that the PLD has insufficient resources to implement the duplicate circuit of the sub-circuit along with the design.

5. The method of claim 4, further comprising:
determining a starting probe point in a design; and
determining the sub-circuit that affects a signal at the probe point.

6. The method of claim 4, further comprising storing in retentive storage each test vector that produce unequal voltage levels between a net in the sub-circuit and a corresponding net in the duplicate circuit.

7. The method of claim 4, further comprising:
comparing a signal from each segment of wire in the faulty net to a signal from a segment of wire in the corresponding net in the duplicate circuit; and
identifying a segment of wire in the faulty net as faulty in response to the signal from the wire segment in the faulty net being unequal to the signal from the segment of wire in the corresponding net of the duplicate circuit.

8. The method of claim 4, further comprising:
generating a second configuration data set that implements a second comparison circuit, that implements a respective route from each wire segment in the faulty net to an input pin of the second comparison circuit, and that implements routes, corresponding to each wire segment in the faulty net, from a wire segment in the net in the duplicate circuit that corresponds to the faulty net in the sub-circuit to respective input pins of the second comparison circuits;
reconfiguring the PLD with the second configuration data set;
applying one or more test vectors to the plurality of PLD input pins; and
identifying a wire segment in the fault net as a faulty wire segment in response to the second comparison circuit detecting unequal signals from a wire segment in the fault net and the wire segment in the duplicate circuit.

9. The method of claim 8, further comprising:
determining a starting probe point in a design; and
determining the sub-circuit that affects a signal at the probe point.

10. The method of claim 9, further comprising storing in retentive storage each test vector that produce unequal voltage levels between a net in the sub-circuit and a corresponding net in the duplicate circuit.

11. The method of claim 4, further comprising:
storing in retentive storage each test vector that produce unequal voltage levels between a net in the sub-circuit and a corresponding net in the duplicate circuit;
comparing a signal from each segment of wire in the faulty net to a signal from a segment of wire in the corresponding net in the duplicate circuit; and
identifying a segment of wire in the faulty net as faulty in response to the signal from the wire segment in the faulty net being unequal to the signal from the segment of wire in the corresponding net of the duplicate circuit.

12. A apparatus for identifying a faulty net in a design implemented in a programmable logic device (PLD), comprising:
means for generating a first configuration data set that implements a sub-circuit of a design on a PLD, that implements a duplicate circuit of the sub-circuit on the PLD, that implements respective routes on the PLD for input signals from a plurality of PLD input pins to respective input pins of the sub-circuit and to corresponding input pins of the duplicate circuit, that implements a first comparison circuit, that implements a respective route from each net in the sub-circuit to an input pin of the comparison circuit and a respective route from each net in the duplicate circuit that corresponds to a net in the sub-circuit, to an input pin of the comparison circuit;
means for configuring the PLD with the first configuration data set;
means for applying one or more test vectors to the plurality of PLD input pins;
means for identifying a net in the sub-circuit as faulty in response to the first comparison circuit detecting unequal signals from the net in the sub-circuit and the corresponding net in the duplicate circuit;
means for determining whether the PLD has sufficient resources to implement the duplicate circuit of the sub-circuit along with the design; and
means for generating the first configuration data set without parts of the design that are not part of the sub-circuit in response to determining that the PLD has insufficient resources to implement the duplicate circuit of the sub-circuit along with the design.

13. Software code stored in a computer readable medium for identifying a faulty net in a design implemented on a programmable logic device (PLD), the code, which when executed by a computer, performs the steps comprising:
code for generating configuration data that implements a duplicate circuit of a failing sub-circuit in the design;
code for configuring the PLD with the configuration data that implements the failing sub-circuit and the duplicate circuit;
code for probing at least one accessible point of a signal in the failing sub-circuit;
code for routing the at least one accessible point to a comparison circuit for comparing a signal of the at least one accessible point with a related signal in the duplicate circuit;
code for determining whether the PLD has sufficient resources to implement the duplicate circuit of the failing sub-circuit along with the design; and
code for generating the configuration data without parts of the design that are not part of the failing sub-circuit in response to determining that the PLD has insufficient resources to implement a duplicate circuit of the failing sub-circuit.

14. The software code of claim 13, wherein the at least one accessible point is selected from a set of accessibility points associated with the signal's name.

15. The software code of claim 13 wherein the code for routing may alternatively route the at least one accessible point to a flip-flop or an input/output.

* * * * *